United States Patent [19]
Yoneda et al.

[11] Patent Number: 5,202,592
[45] Date of Patent: Apr. 13, 1993

[54] PROGRAMMABLE LOGIC DEVICE

[75] Inventors: Masato Yoneda, Ichihara; Hisaya Keida, Chiba, both of Japan

[73] Assignee: Kawasaki Steel Corporation, Hyogo, Japan

[21] Appl. No.: 741,466

[22] PCT Filed: Dec. 7, 1990

[86] PCT No.: PCT/JP90/01597
§ 371 Date: Sep. 11, 1991
§ 102(e) Date: Sep. 11, 1991

[87] PCT Pub. No.: WO91/09468
PCT Pub. Date: Jun. 27, 1991

[30] Foreign Application Priority Data
Dec. 8, 1989 [JP] Japan ................... 1-319624

[51] Int. Cl.⁵ ............... H03K 19/094; H03K 14/177
[52] U.S. Cl. ................... 307/465; 307/468; 364/716
[58] Field of Search ............ 307/465, 243, 468, 469; 364/716

[56] References Cited
U.S. PATENT DOCUMENTS

| | | | |
|---|---|---|---|
| 4,796,229 | 1/1989 | Greer, Jr. et al. | 307/465 |
| 4,876,466 | 10/1989 | Kondou et al. | 307/465 |
| 4,930,098 | 5/1990 | Allen | 364/716 |
| 4,935,737 | 6/1990 | Izbicki et al. | 307/465 |

Primary Examiner—Edward P. Westin
Assistant Examiner—Richard Roseen
Attorney, Agent, or Firm—Oliff & Berridge

[57] ABSTRACT

In selectors $21_0$–$21_3$ two pull-up switching elements $40_0$–$40_3$, $42_0$–$42_3$, the elements being connected in series to each other in each selector, are additionally provided instead of a don't care-setting two-input NAND gate, for connecting or disconnecting connection lines of outputs of positive logic switching elements $24_0$–$24_3$ and those of negative logic switching elements $23_0$–$23_3$ with or from a power supply line Vdd. First memory cells $M_{00}$–$M_{30}$ control on-off states of negative logic switching elements $23_0$–$23_3$ and ones $40_0$–$40_3$ of pull-up switching elements, and second memory cells $M_{01}$–$M_{31}$ control on-off states of positive logic switching elements $24_0$–$24_3$ and the others $42_1$–$42_3$ of the pull-up switching elements. Thus, use of a prior art two-input NAND gate is eliminated and hence the number of transistors is reduced.

18 Claims, 7 Drawing Sheets

| STORAGE CONTENT IN MEMORY CELLS | | OUTPUT OF SELECTOR |
|---|---|---|
| M x0 | M x1 | |
| 0 | 0 | HIGH LEVEL FIXED (DON'T CARE) |
| 0 | 1 | Ix (POSITIVE LOGIC) |
| 1 | 0 | $\overline{I}x$ (NEGATIVE LOGIC) |
| 1 | 1 | INHIBITED |

PROGRAMMABLE LOGIC DEVICE

DESCRIPTION

1. Technical Field

The present invention relates to a programmable logic device with which user is capable of realizing any combinational logic circuit at his hand, and more specifically to a programmable logic device where a layout area thereof can be reduced and where a working speed can be improved.

2. Background Art

There are known in prior practice programmable logic devices (hereinafter referred to as PLD) with which a user can realize an arbitrary logic circuit at his hand. The PLD includes a plurality of programmable logic elements (hereinafter referred to as PLE) disposed on a chip, each of which elements has its input and output optionally connectable through programmable wiring. Use of such a PLD assures a desired large-scale circuit by allowing a user to select functions of the PLEs and wirings thereamong PLEs.

Those prior art PLEs include PLAs (programmable logic array) each having programmable AND planes and OR planes, further including logic circuits of a table look-up type using a memory.

Figure 8:
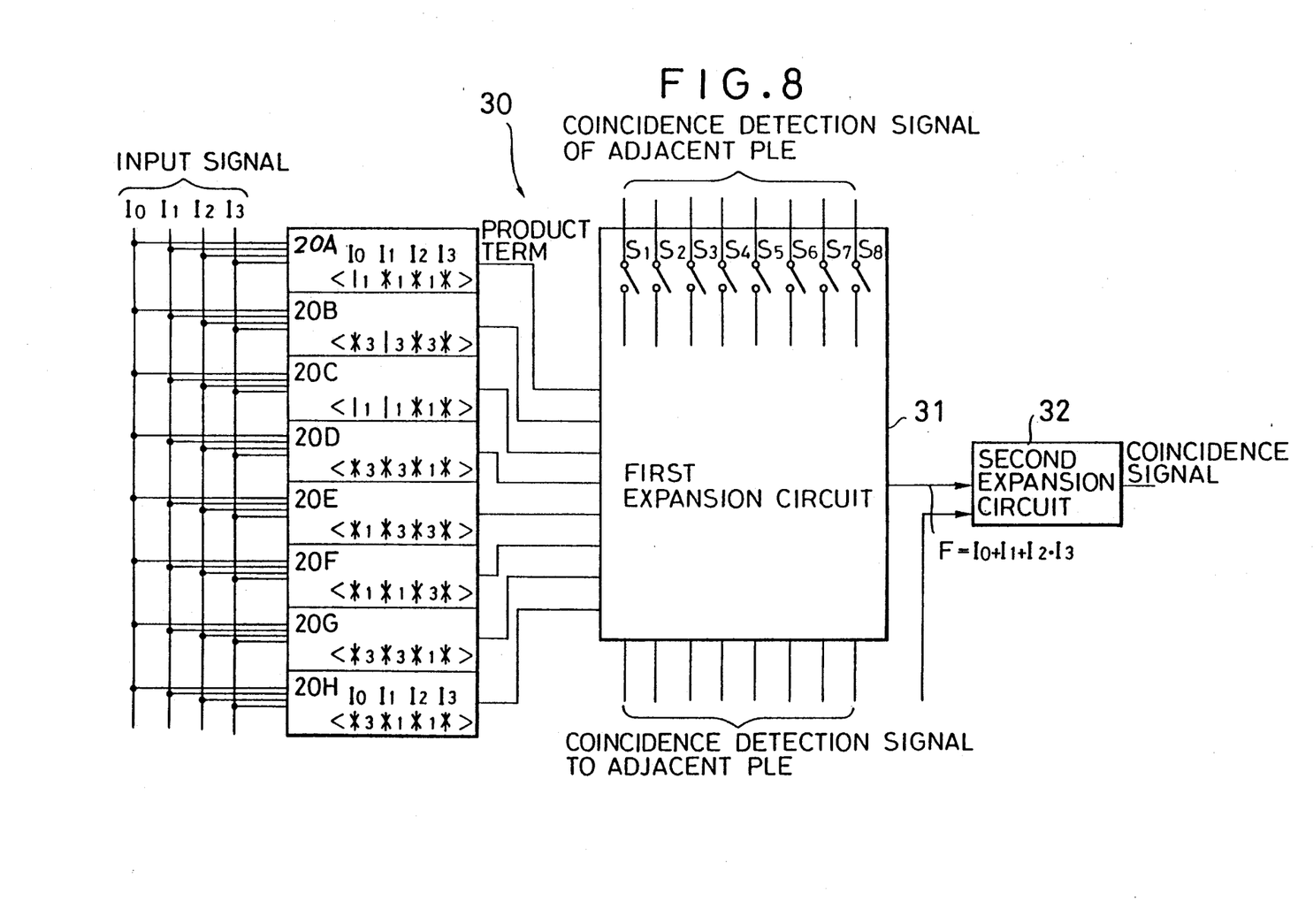
FIG. 8 is a block diagram exemplarily illustrating the arrangement of programmable logic elements constituting a programmable logic device proposed in Japanese Patent Application No. 63-6197 by the present applicant.

The present applicant has proposed previously a programmable logic device as described in Japanese Patent Application No. 63-6197, wherein as illustrated in FIG. 8 there are provided a required number (8 in the figure) of coincidence detector circuits 20A through 20H of a combination of N input signals (four input signals $I_0$ through $I_3$ in the figure) whereby there are eliminated such wasteful programmable elements as in the table look-up system, and wherein product term lines of the PLA are expanded by a first expansion circuit 31 and likewise outputs (coincidence signals) of coincidence detector circuits of other PLEs are connected therewith whereby coincidence signals can be outputted correspondingly to input signals of the number greater than that of the input signals, and further wherein coincidence signals of further other PLEs are connected by a second expansion circuit 32 to expand the number of combinations of stored input signals exceeding the number of the coincidence detector circuits whereby the number of input signals into the coincidence detector circuit of each PLE can be set to be smaller.

Figure 9:
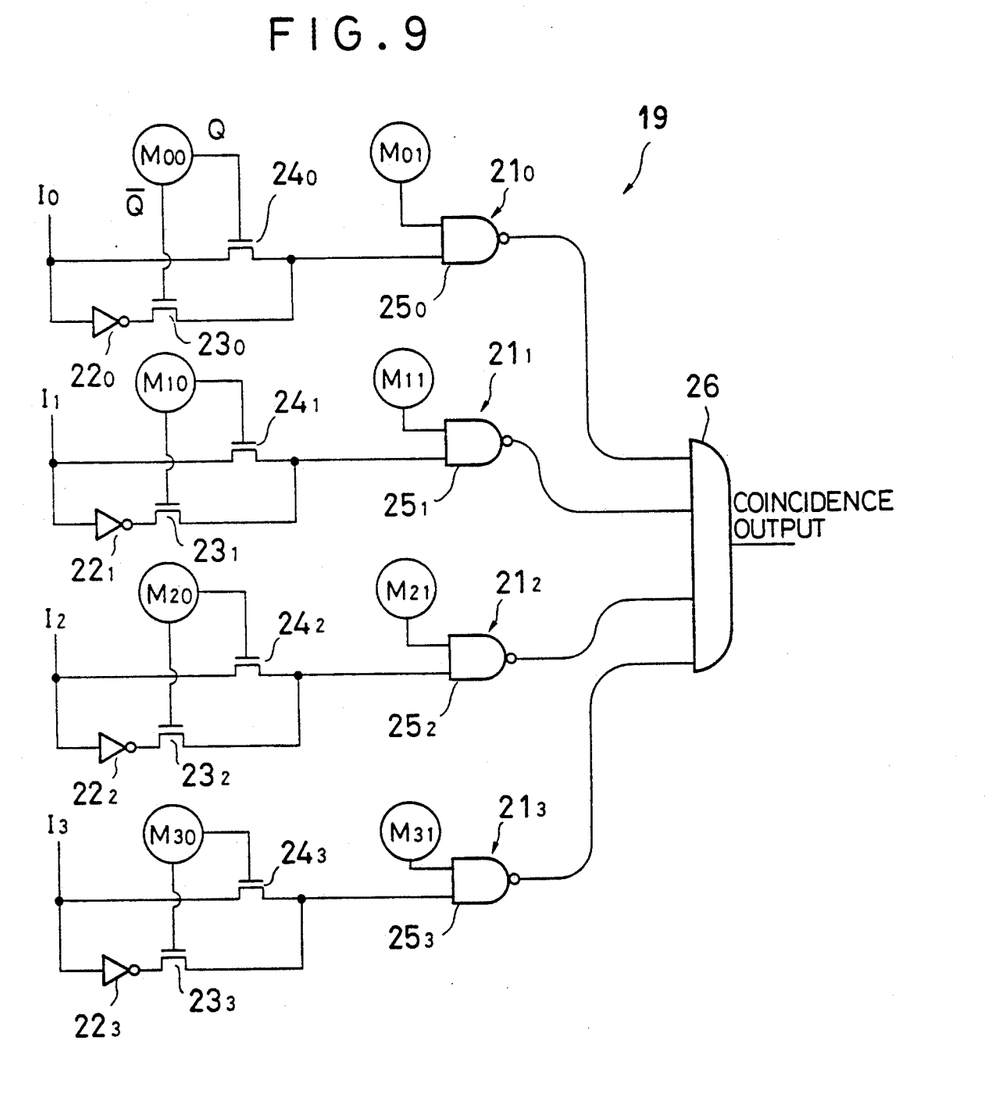
FIG. 9 is a circuit diagram illustrating the arrangement of a coincidence detector circuit in the programmable logic device of FIG. 8.

The present applicant has further proposed as the foregoing coincidence detector circuit 19, which comprises, as illustrated in FIG. 9, invertors $22_0$ through $22_3$ each for inverting input signals $I_0$ through $I_3$, negative logic switching elements $23_0$ through $23_3$ each for conducting or interrupting outputs from the invertors $22_0$ through $22_3$, positive logic switching elements $24_0$ through $24_3$ each for allowing the input signals $I_0$ through $I_3$ to be conducted therethrough or interrupted thereby intactly; first memory cells $M_{00}$ through $M_{30}$ each for complementarily controlling on/off states of the positive and negative logic switching elements $24_0$ through $24_3$ and $23_0$ through $23_3$; a plurality (four in the figure) of selectors $21_0$ through $21_3$ each including two-input NAND gates $25_0$ through $25_3$ each for issuing the negation of a logical product of connection points of outputs from said positive logic switching elements $24_0$ through $24_3$ and those from said negative logic switching elements $23_0$ through $23_3$, and outputs of second memory cells $M_{01}$ through $M_{31}$ for setting a don't care input which may take any logical stage, and each further including said second memory cells $M_{01}$ through $M_{31}$, and a four-input AND gate 26 for issuing as the coincidence output a logical product of outputs from the selectors $21_0$ through $21_3$.

Figure 10:
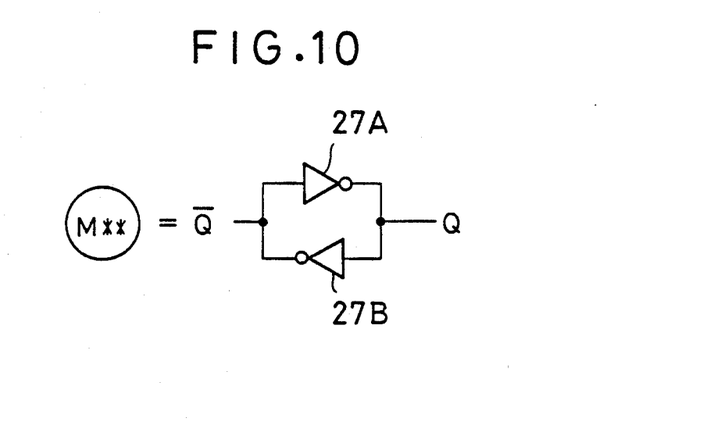
FIG. 10 is a circuit digram illustrating in a concrete manner the arrangement of each memory cell.

Each of the memory cells $M_{00}$ through $M_{30}$ and $M_{01}$ through $M_{31}$ comprises a pair of SRAMs (static random access memory) 27A, 27B connected parallely oppositely to each other as illustrated in FIG. 10 for example, one output terminal of which issues an output Q and the other of which issues an inverted output $\overline{Q}$.

In the coincidence detector circuit 19, any one of the negative and positive logics of the input signals $I_0$ through $I_3$ may be selectable to be outputted by switching on any ones of the negative logical switching elements $23_0$ through $23_3$ or the positive logical switching elements $24_0$ through $24_3$ using the complementary outputs $Q$, $\overline{Q}$ of the first memory cells $M_{00}$ through $M_{30}$ and switching off the other ones of the same. In addition, the output of the NAND gates $25_0$ through $25_3$ of the selector may be made a high level (1) and the input from the selector to the AND gate 26 may be provided as a don't care input by setting the output of the second memory cells $M_{01}$ through $M_{31}$ to a low level (0). Further, for the selector to detect the coincidence, output of the second memory cell used in the selector have been set to a high level (1).

The NAND gates $25_0$ through $25_3$ of the selectors $21_0$ through $21_3$ provide their outputs to the four-input AND gate 26. If any input selected by any selector is a low level, then the output of the associated NAND gate gets a high level. When all outputs of the NAND gates $25_0$ through $25_3$ get a high level as such or by setting of the the don't care input, the high level is provided on the output of the AND gate 26 as a coincidence output. Coincidence among the input signals is thus detectable by storing any combination of the four input signals $I_0$ through $I_3$ in the first memory cells $M_{00}$ through $M_{30}$.

Such selectors $21_0$ through $21_3$ however have some drawbacks: they usually require the two-input NAND gates $25_0$ through $25_3$ occupying an area corresponding to that of four CMOS transistors in order to set the don't care input. Additionally, they require a large-sized transistor to permit any signal to pass through the two-input NAND gate. This increases a layout area to cause a PLD including such a large-sized transistor to be large-sized and the working speed of the PLD to be lowered.

DISCLOSURE OF THE INVENTION

In view of the drawbacks with the background art, it is a first object of the present invention to provide a PLD including a selector capable of reducing a layout area as well as of improving a working speed.

A second object of the present invention is to provide a PLD wherein in said selector positive and negative logic switching elements do not take a prohibited combination to result in fail safety and ease of a design thereof.

A third object of the present invention is to provide a PLD wherein said selector permits not only positive logic, negative logic, and don't care by pull-up but by pull-down to be selected.

A fourth object of the present invention is to provide a PLD wherein the selection of the positive logic, negative logic, and pull-up and pull-down is achievable with a few memory cells.

A fifth object of the present invention is to improve the flexibility of a design.

To achieve the first object, in a PLD according to the present invention, which includes selectors each for selectively outputting any one among signals at least involving a positive logic signal of the same logic as that of any input signal, a negative logic signal yielded by inverting the logic of the input signal, and a fixed signal independent of the input signal, said selector comprises: an invertor for inverting the input signal; a negative logic switching element for conducting an invertor output or interrupting the same; a positive logic switching element for conducting said input signal intactly or interrupting the same; a plurality of fixed potential switching elements connected in series to each other each for connecting or disconnecting connection points of outputs of the positive logic switching elements and those of the negative ones with or from predetermined potential lines; a first memory cell for controlling the on-off state of said negative logic switching elements and ones of said fixed potential switching elements; and a second memory cell for controlling the on-off state of the positive logic switching elements and the others of the fixed potential switching elements.

To achieve the second object, the present invention includes means which forcedly switches off any ones of said negative and positive logic switching elements when the others of said negative and positive logic switching elements are on.

To achieve the third object of the present invention, said predetermined potential lines are assumed to be a high level potential line (e.g., a power supply line) and a low level potential line (e.g., a ground line), and means is provided which can select any of said potential lines.

To further achieve the same third object of the present invention, said means which can select any of said potential lines includes a pull-up switching element (e.g., p channel MOS transistor) for connecting or disconnecting said connection point with or from said high level potential line and a pull-down switching element (e.g., n channel MOS transistor) for connecting or disconnecting said connection point with or from said low level potential line, both being provided independently of said fixed potential switching element, and a third memory for controlling the on-off state of the pull-up and pull-down switching elements in a complementary manner.

To achieve the fourth object of the present invention, said means which can select any of said potential lines includes pull-up switching elements and pull-down switching elements, both shared with said fixed potential switching elements, and a combinational circuit for controlling the on-off states of said negative logic and positive logic switching elements or of said pull-up and pull-down switching elements by a combination of outputs of said first and second memory cells.

To achieve the foregoing third object of the present invention with a simplified construction, the present invention includes an AND gate for outputting a logical product of a plurality of selector outputs, pull-up means provided in all selectors connected to said AND gate for connecting the outputs of the selectors to high level potential line, and pull-down means provided in at least any one of the selectors connected to said AND gate for connecting an output of said any one selectors connected to said AND gate to a low level potential line.

To achieve the fifth object of the present invention, the present invention includes, in such a PLD as described above, a plurality of coincidence detector circuits including an AND gate for outputting a logical product of outputs of a plurality of selector outputs, an OR gate for outputting a logical sum of outputs of the plurality of coincidence detector circuits, and an AND gate for outputting a logical product of the outputs of said plurality of coincidence detector circuits.

Figure 1:
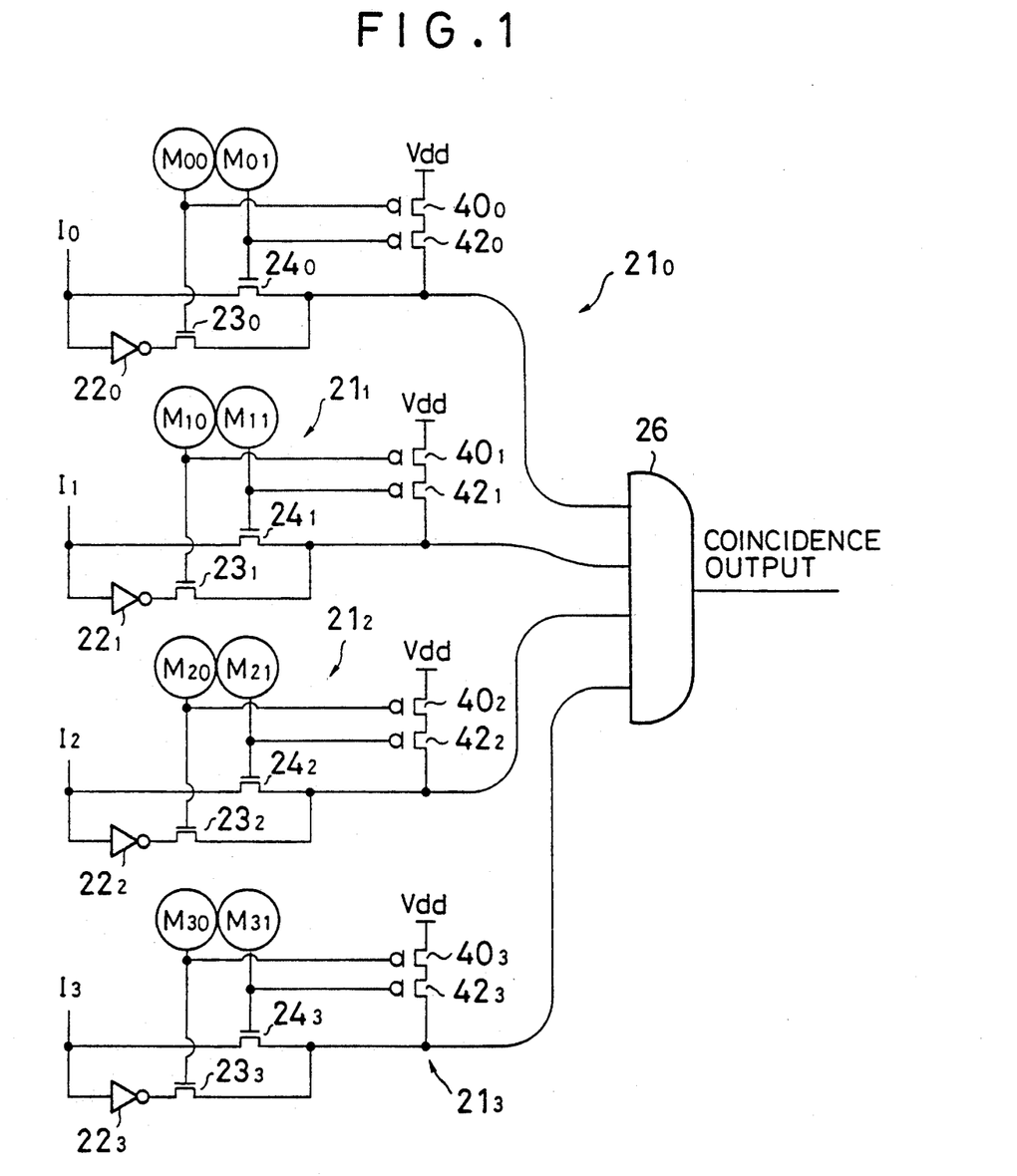
FIG. 1 is a circuit diagram illustrating a coincidence detector circuit used in a first embodiment of a programmable logic device according to the present invention.
Figure 2:
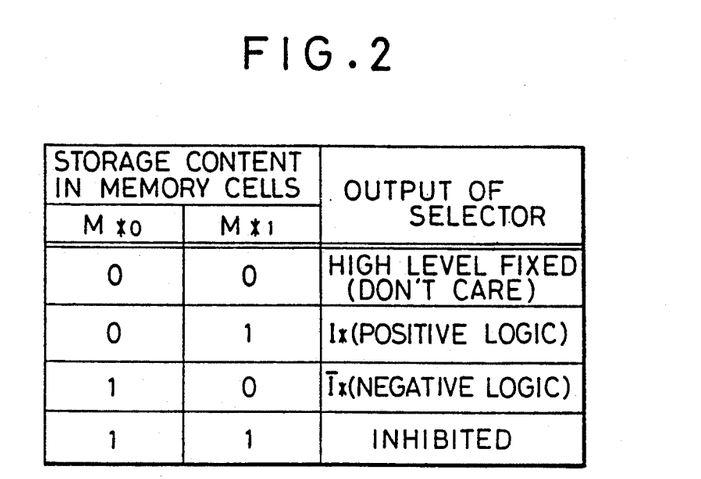
FIG. 2 is a table illustrating an interrelation between storage contents in a memory cell and selector outputs in the first embodiment.

In accordance with the present invention, in such selectors $21_0$ through $21_3$ as illustrated in FIG. 9, use of the don't care-setting two-input NAND gates $25_0$ through $25_3$ is eliminated, and instead, there are additionally provided as illustrated in FIG. 1, a plurality of fixed potential (for pull-up in the figure) switching elements $40_0$ through $40_3$, $42_0$ through $42_3$, the paired (for each selector in the figure) elements $40_0$ and $42_0$, $40_1$ and $42_1$, and so on being connected in series to each other, for connecting or disconnecting a connection line of outputs of the positive logic switching elements $24_0$ through $24_3$ and outputs of the negative logic switching elements $23_0$ through $23_3$ with or from a predetermined potential line (a power supply line Vdd in FIG. 1). On-off states of the negative logic switching elements $23_0$ through $23_3$ and of ones $40_0$ through $40_3$ of the pull-up switching elements are controlled by first memory cells $M_{00}$ through $M_{30}$, while on-off states of the positive logic switching elements $24_0$ through $24_3$ and the others $42_1$ through $42_3$ of the pull-up switching elements are controlled by second memory cells $M_{01}$ through $M_{31}$. More specifically, as illustrated in FIG. 2, when storage contents in first and second memory cells $M\cdot_0$ and $M\cdot_1$ are both set to a low level (0), an output of a selector $21\cdot$ is fixed to a high level (power supply potential) for a don't care-state. Additionally, when the storage contents of any one of the first and second memory cells $M\cdot_0$ and $M\cdot_1$ are set to a high level (1), a positive logical signal $I\cdot$ or a logical logic signal $\overline{I\cdot}$ is outputted. Herein, if both storage contents in the first and second memory cells $M\cdot_0$, $M\cdot_1$ are set to the high level (1), the positive logical signal $I\cdot$ and the negative logical signal $\overline{I\cdot}$ would be collated, so that this combination is inhibited by software upon storage thereof into the memory cells, for example.

With such construction, there is eliminated use of transistors (four in the case of CMOS transistors) required for the two-input NAND gate in prior practice, and hence two transistors can be reduced even through two additionally incorporated pull-up switching elements $40\cdot$ and $42\cdot$ are taken into consideration. Moreover, since the incorporated transistors take the form of a series connection of p channel MOS transistors for example and do not allow any signal to pass directly therethrough and hence are minimum-sized, an increase of the area thereof can substantially be ignored. Accordingly, a layout area can be decreased with a working speed improved.

Figure 4:
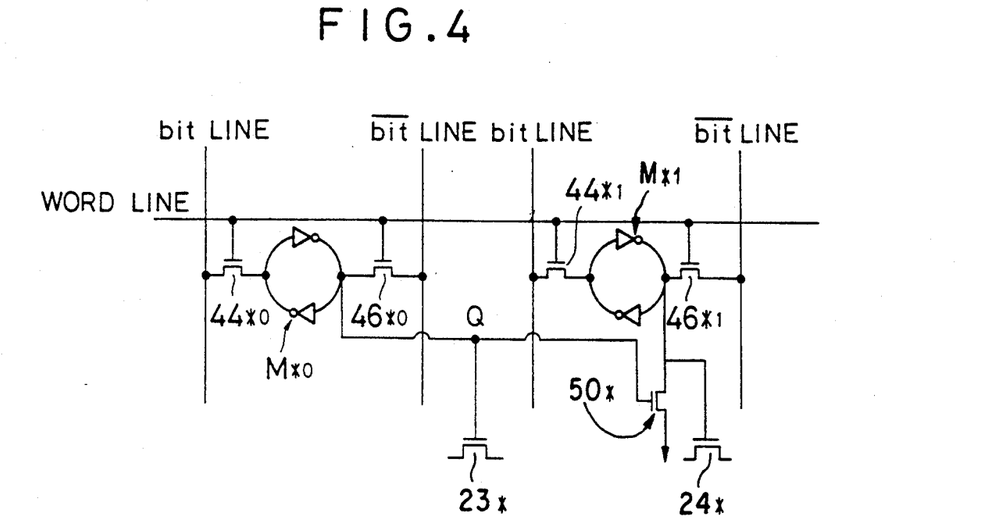
FIG. 4 is a circuit diagram illustrating a write circuit into a memory cell used in a second embodiment of the present invention.

In the case where there is provided means, as illustrated in FIG. 4 for example, for forcedly switching off any one of said negative and positive logic switching elements (pull-down switching elements $50\cdot$ in the figure) when the other of those switching elements is switched on, the memory cells $M\cdot_0$ and $M\cdot_1$ do not get a high level simultaneously even at any transient such as building up of a power supply, and hence there can be prevented a trouble from occurring owing to collation of a positive logic signal $I\cdot$ and a negative logic signal $\overline{I\cdot}$. Although such a trouble can be, as a matter of course, dealt with through software by controlling write operation into the memory cells the aforementioned solution with use of the circuit brings about fail safe and hence eases a circuit design. In this case, although the number of transistors used is further increased owing to the additional pull-down switching element 50, any signal can not transmit the pull-down switching element, and hence its occupation area may be very small and an area increase may be ignored.

With the circuit arrangements illustrated in FIGS. 1 and 4, it is confirmed that the layout area was reduced by about 15% without any labor compared with prior practice and the working speed was improved by about 20%.

Figure 5:
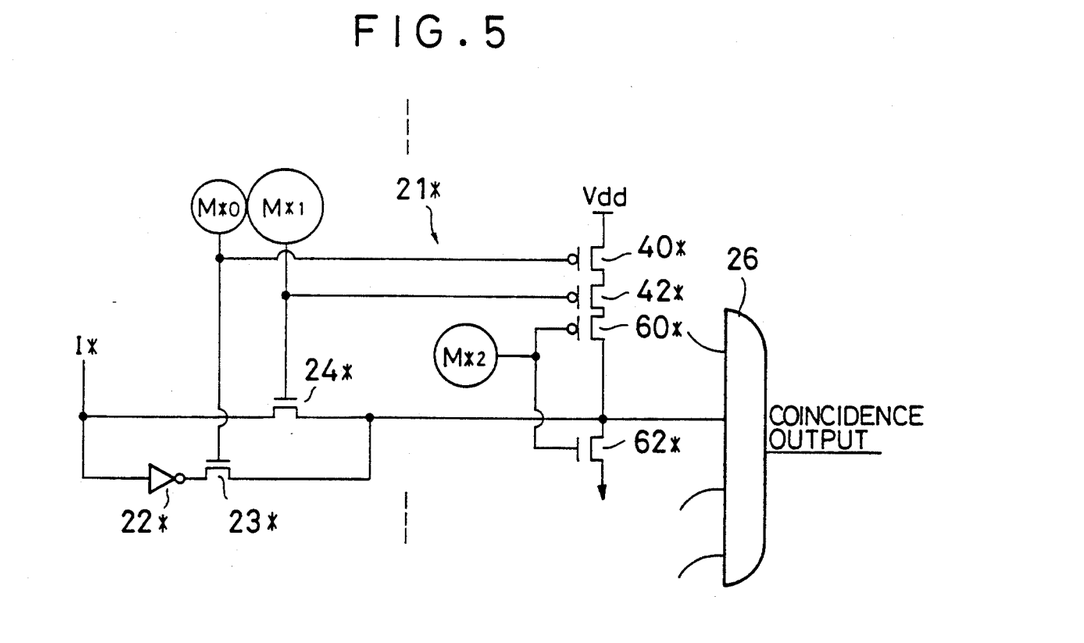
FIG. 5 is a circuit diagram illustrating a main portion of a coincidence detector circuit used in a third embodiment of the present invention.

Additionally, there is further improved flexibility in the case where there is provided means (e.g., a third memory cell M*$_2$, and a pull-up switching element 60* and a pull-down switching element 62*), as illustrated in FIG. 5 for example, in which said predetermined potential lines are assumed to be a high level potential line (a power supply line Vdd in the figure) and a low level potential line (a ground line in the figure) and the means can select any of those lines. More specifically, if a don't care input is set with said arrangement and a coincidence output is made a high level thereby, a later stage OR gate 80 illustrated in FIG. 7 for example can not be used and hence another input signal entered into the same OR gate 80 can not be utilized. To solve this, it is considered a situation that upon setting a don'care input the same input is entered as the other input to be entered into the OR gate, but there is produced another problem in that situation that if one is of a three-input type, then the other can not be of a four input type for example, and hence any device is required for a circuit design and the flexibility of the design is decreased. Against this, in accordance with the present invention where any of the high level potential line and the low level potential line is selectable, an output of the selector is pulled up to a high level to result in a don't care state while it is pulled down to a low level to utilize the later stage OR gate.

Herein, said means which can select any of a high level potential line and a low level potential line can be simplified in its arrangement if it includes, as illustrated in FIG. 5 for example, a pull-up switching element 60* for connecting or disconnecting said connection point with or from the high level potential line (the power supply line Vdd in the figure), the pull-down switching element 62* for connecting or disconnecting said connection point with or from the low level potential line (the ground line in the figure), independently of the fixed potential switching elements 40* and 42*, and the third memory cell M*$_2$ for controlling the on-off states of said pull-up and pull-down switching elements 60* and 62* in a complementary manner. This arrangement is preferable particularly for cases where there are existent excess memory cells.

On the other hand, a function of FIG. 5 is realizable with the total two memory cells incorporated in each selector without further provision of any memory cell if said means, which can select any of a high level potential line and a low level potential line, includes pull-up and pull-down switching elements 40* and 42*, and 64* and 66* shared with said fixed potential switching element and a combinational circuit (two gates 70* and 72* in the figure) for controlling the on-off states of said negative logic and positive logic switching elements 23* and 24* (in the case of FIG. 6) or said pull-up and pull-down switching elements 40* and 42*, and 64* and 66* by a combination of outputs of said first and second memory cells M*$_0$ and M*$_1$.

In the case where there is provided on a later stage the AND gate 26 for outputting a logical product of selector outputs, whilst the pull-up means for connecting the output of the selector 21* with the high level potential line should be provided for all selectors connected to the AND gate 26, the pull-down means for connecting the output of the selector 21* with the low level potential line may be provided for at least any one of the selectors connected to the AND gate 26 and hence an area increase due to the pull-down means can be avoided.

Figure 7:
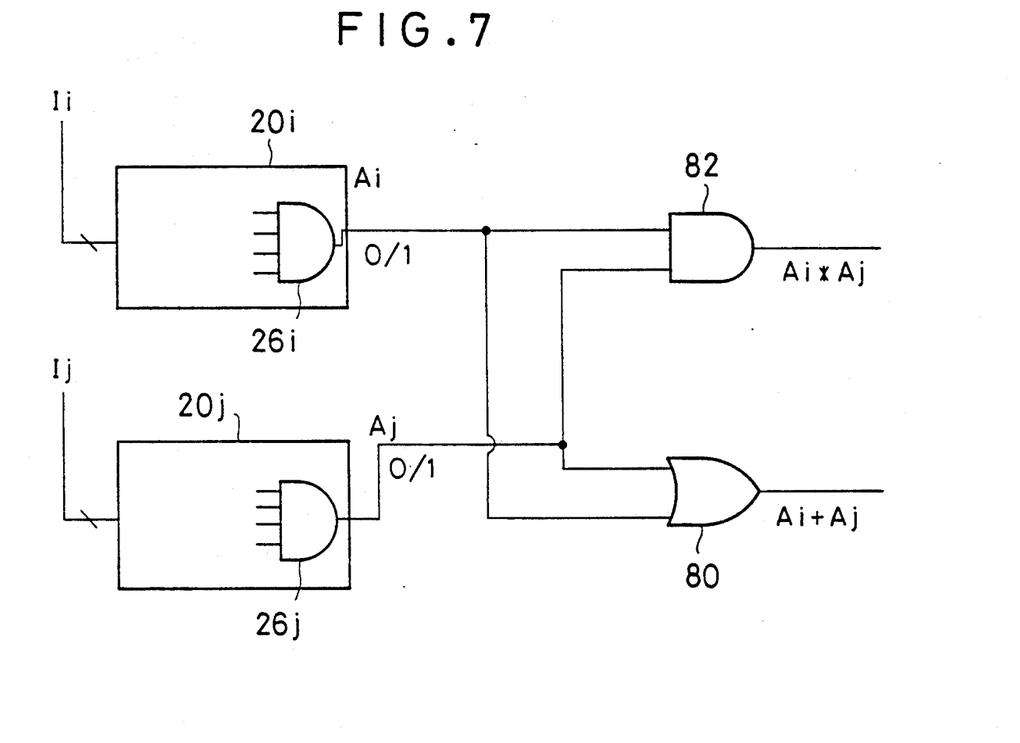
FIG. 7 is a circuit diagram illustrating a logic circuit used in a fifth embodiment of the present invention.

Further, flexibility of logic configuration is improved in the case where there are provided, as illustrated in FIG. 7 for example, a plurality of (two in the figure) coincidence detector circuits 20$i$, 20$j$ including AND gates 26$i$, 26$j$, each for outputting a logical product of a plurality of selector outputs, an OR gate 80 for outputting a logical sum of outputs of the plurality of the coincidence detector circuit 20$i$, 20$j$, and an AND gate 82 for outputting a logical product of the outputs of the plurality of the coincidence selector circuit 20$i$, 20$j$. In the case where there is incorporated as said coincidence detector circuit one including a selector which also enables pull-down of an output thereof as described above, particularly coincidence outputs Ai, Aj of the coincidence detector circuits 20$i$, 20$j$ can be set quite independently of input signals Ii, Ij to make possible either of the pull-down and the pull-up, and hence a don't care input into the next stage OR gate 80 and the AND gate 82 can be formed very easily.

BEST MODE FOR CARRYING OUT THE INVENTION

In what follows, embodiments of the present invention will be described in detail.

The first embodiment of the present invention associated with the coincidence detector circuit 20 comprises, as illustrated in FIG. 1, invertors $22_0$ through $22_3$ for inverting input signals $I_0$ through $I_3$, negative logic switching elements $23_0$ through $23_3$ each for conducting or interrupting invertor outputs, positive logic switching elements $24_0$ through $24_3$ each for conducting or interrupting said input signals intactly, pull-up switching elements $40_0$ through $40_3$, $42_0$ through $42_3$, each pair $40_0$ and $42_0$ through $40_3$ and $42_3$ connected in series to each other for connecting or disconnecting connection points of said positive logic switching element outputs and said negative logic switching element outputs with or from a power supply line Vdd (high level potential line), four, for example, selectors $21_0$ through $21_3$ each including first memory cells $M_{00}$ through $M_{30}$ each for controlling the on-off states of said negative logic switching elements $23_0$ through $23_3$ and ones $40_0$ through $40_3$ of the pull-up switching elements and further including second memory cells $M_{01}$ each for controlling the on-off states of said positive logic switching elements $24_0$ through $24_3$ and the others $42_0$ through $42_3$ of the pull-up switching elements, and a four-input AND gate 26 for outputting a logical product of outputs of said selectors $21_0$ through $21_3$.

For said power supply switching elements 40•, 42•, there may be employed p channel MOS transistors connected in series, for example.

Operation of the first embodiment is as follows.

For setting a certain selector 21• to a don't care state in the present embodiment, memory cells M•$_0$ and M•$_1$ of the selector are both set to a low level (0) as illustrated in FIG. 2. Hereby, pull-up switching elements 40•, 42• are both switched on, so that an output of the selector 21• is fixed to a power supply line Vdd level, i.e., a high level for the don't care state.

For outputting an input signal I• intactly in the positive logic, storage contents in a first memory cell M•$_0$ are set to 0 and storage contents in a second memory cell M•$_1$ are set to 1. Hereby, a negative logic switching element 23• is switched off and a positive logic switching element 24• is switched on, so that the output of the selector 21• gets a positive logic signal I• as the intact input signal I•.

For outputting a negative logic signal $\overline{I•}$, an inverted signal of the input signal I•, storage contents in a first memory cell M•$_0$ are set to 1, and storage contents in a second memory cell M•$_1$ are set to 0. Hereby, the negative logic switching element 23• gets on, and the positive logic switching element 24• gets off, so that the output of the selector 21• becomes the negative logic signal $\overline{I•}$.

In the case where storage contents in either of the first and second memory cells M•$_0$, M•$_1$ are 1, either of the pull-up switching elements 40•, 42• gets off, so that the power supply potential Vdd is not outputted upon the positive logic signal and negative logic signals being outputted.

In the other hand, once the storage contents in the first and second memory cell M•$_0$, M•$_1$ are both 1, the negative logic switching element 23• and the positive logic switching element 24• both get on and hence permit the positive logic signal I• and the negative logic signal $\overline{I•}$ to collate. The situation should therefore be prohibited separately by software, etc., so as not to be defined.

In the present embodiment, one gate comprising usually four CMOS transistors can be reduced for each selector compared with the prior art illustrated in FIG. 9, and further an additionally incorporated transistor comprises a series connection of p channel MOSs which does not allow any signal to transmit directly therethrough, so that the transistor can be minimum-sized and allows its area increase to be substantially ignored. Accordingly, a layout area can be reduced to improve a working speed.

Figure 3:
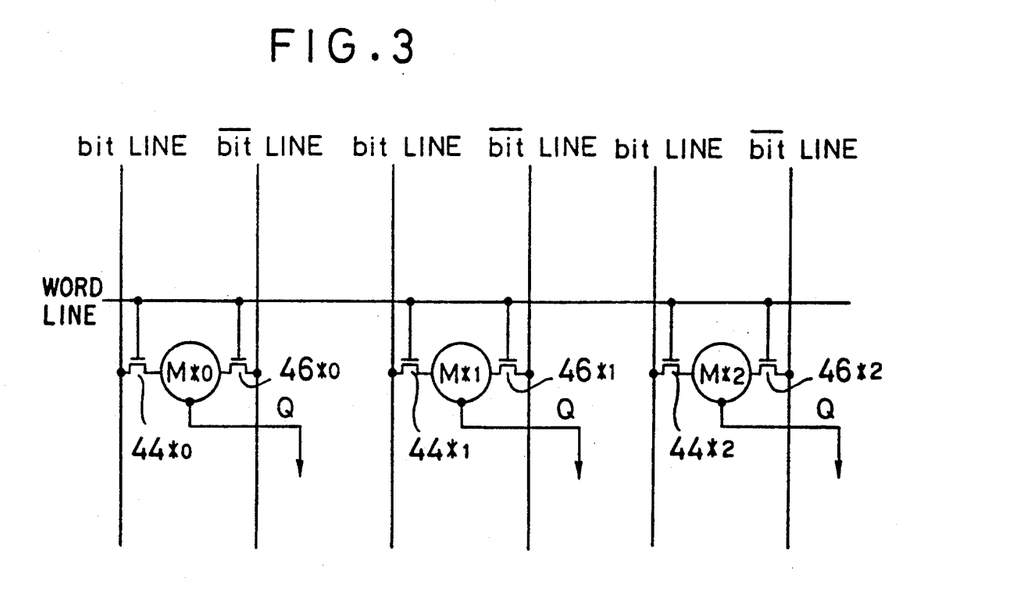
FIG. 3 is a circuit diagram illustrating a write circuit into the memory cell in the first embodiment.

Herein, writing into said first and second memory cells M•$_0$, M•$_1$ is effected by connecting bit lines or $\overline{bit}$ lines and a WORD line with write switching elements 44•$_0$, 46•$_0$, 44•$_1$, and 46•$_1$ as illustrated in FIG. 3 for example. Thereupon, it is necessary to prevent, using software, etc., 1 from being simultaneously written into the first and second memory cells M•$_0$, M•$_1$. However, particularly in a transient state such as that in making of the power supply, there are sometimes occur such a situation that 1 is simultaneously written in the first and second memory cells. In the following, the second embodiment of the present invention which has solved such a difficulty will be described.

In the second embodiment, as illustrated in FIG. 4, a pull-down switching element 50• comprising an n channel MOS transistor for example is provided in a write circuit into the first and second memory cells M•$_0$, M•$_1$ identical to that illustrated in FIG. 3, which element 50• is operable as 1 appears at an output of said first memory cell M•$_0$ for forcedly bringing about the storage contents in said second memory cell M•$_1$ to 0.

Other items are identical to those described in the first embodiment, and hence the description is omitted.

In the second embodiment, assumed in an initial condition for example the storage contents in the first memory cell M•$_0$ are 0 and those in the second memory cell M•$_1$ are 1, if 1 is to be written erroneously into the first memory cell M•$_0$, the pull-down switching element 50• is switched on at the same time the 1 at the output of the first memory cell M•$_0$ builds up to forcedly drop the storage contents in the second memory cell M•$_1$ to 0. There can thus be prevented without fail an inhibited condition that both outputs of the first and second memory cells get 1, even if it is in a transient state such as that in making of the power supply.

In accordance with the second embodiment, even with erroneous software used for writing into the first and second memory cells or even with a transient state such as that in making of a power supply, the prohibited condition can securely be prevented to result in fail safety and hence ease of a circuit design. Although in the second embodiment the pull-down switching element 50• is additionally incorporated compared with the first embodiment, the pull-down switching element 50• doesn't substantially suffer from its area increase because no signal is transmitted therethrough and a small area n channel MOS transistor can be used for example.

Herein, although in the above first or second embodiment the pull-up switching elements 40•, 42• were provided to pull up the input to the later AND gate 26 to a high level for the don't care state, if the input of the AND gate 26 is set to 1 as such, the later OR gate 80 illustrated for example in FIG. 7 becomes invalid and hence the other signal to be inputted into the OR gate 80 can not be utilized. To solve this problem, it is considered to enter the same input signal also into the corresponding input, but if one is three inputs, the other can not be four inputs to result in reduced flexibility. Thus, circuit arrangement should be devised. Thereupon, if the output of the selector 21• is not only pulled up but pulled down, the later OR gate is made valid. FIG. 5 illustrates the third embodiment of the present invention which demonstrates the above-described countermeasure.

In accordance with the fifth embodiment, in the selector 21• included in the identical coincidence detector circuit 20 to that in the first or second embodiment, a pull-up switching element 60• is additionally intervened between said pull-up switching elements 40•, 42• and the power supply line Vdd, and a pull-down switching element 62• capable of connecting the output of the selector 21• to a ground line (low level potential line) is provided, whereby said switching elements 60•, 62• are on-off controlled in a complementary manner by an output of a third memory cell M•$_2$.

Other items are the same as those in the first embodiment, and the description is omitted.

In the third embodiment, besides the effect of the first embodiment, the input of the AND gate 26 can be pulled down by switching on the pull-down switching element 62• (at this time, the pull-up switching element 60• is switched off) responsibly to the storage condition of the third memory cell M•$_2$. Accordingly, a later stage OR gate 80 illustrate in FIG. 7 can effectually be utilized.

Figure 6:
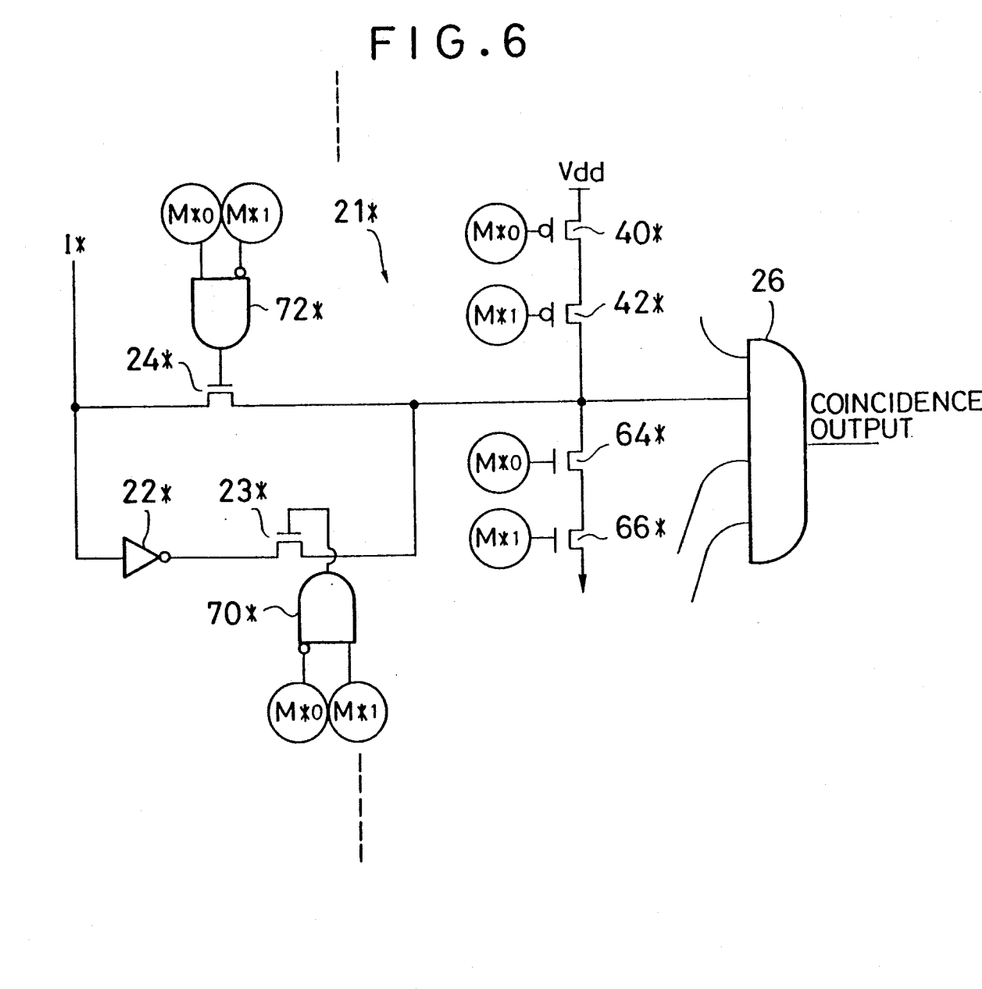
FIG. 6 is a circuit diagram illustrating a main portion of a coincidence detector circuit used in a fourth embodiment of the present invention.

Herein, the third embodiment has although enjoying the flexibility of the circuit being improved, a problem occurs that the number of the memory cells is increased. FIG. 6 illustrates a fourth embodiment of the present invention as solving the just-mentioned problem, in which embodiment the identical function to that in the third embodiment is achieved only by the first and second two memory cells M•$_0$, M•$_1$.

The fourth embodiment includes, as illustrated in FIG. 6, pull-up switching elements 40•, 42• connected in series to each other and identical to those in the first embodiment, two pull-down switching elements 64•, 66• connected in series to each other each for connecting a selector output to a ground line, and two gates 70•, 72• for controlling the on-off state of negative and positive logic switching elements 23•, 24• identical to those in the first embodiment by a combination of outputs of the first and second memory cells M•$_0$, M•$_1$.

Other items are the same as those in the first embodiment and the description is omitted.

In the fourth embodiment, for pulling up the output of the selector 21• by setting it to a don't care state, storage contents in the first and second memory cells M•$_0$, M•$_1$ are both set to 0, and the pull-up switching elements 40•, 42• are switched on and the pull-down switching elements 64•, 66• are switched off. Hereby, an output of an AND gate 26 gets a don't care state.

For pulling down the output of the selector 21•, the storage contents in the first and second memory cells are both reversely set to 1, and the pull-down switching elements 64•, 66• are both switched on and the pull-up switching elements 40•, 42• are both switched off. Hereby, the output of the AND gate 26 is fixed to 1.

On the other hand, for obtaining a positive logic output, the storage contents in the first memory cell M•$_0$ are set to 1 and the storage contents in the second memory cell M•$_1$ are set to 0 to switch on the positive logic switching element 24• by an output of a gate 72•, for example.

Oppositely, for obtaining a negative logic output, the storage contents in the first memory cell M•$_0$ are set to 0 and the storage contents in the second memory cell M•$_1$ are set to 1 to being about the output of the gate 72• to 1 and hence switch on the negative logic switching element 22•.

Although the pull-up switching elements 40•, 42• are needed to be provided at all selector outputs also in the present embodiment as in the third embodiment, the pull-down switching elements 64•, 66• may be provided in any one among the selectors sharing the later stage AND gate 26.

A coincidence detector circuit 20, which is capable of outputting any of the pull-up and pull-down, in such a manner, exhibits particularly higher flexibility and is highly effective. FIG. 7 illustrates an embodiment of a logic circuit using such a coincidence detector circuit 20.

The embodiment includes as illustrated in FIG. 7, a coincidence detector circuit 20$i$ including an AND gate 26$i$ for detecting coincidence among a plurality of inputs Ii, a coincidence detector circuit 20$j$ including an AND gate 26$j$ for detecting coincidence among a plurality of inputs Ij, an OR gate 80 for outputting a logical sum Ai+Aj of coincidence outputs Ai, Aj of said two coincidence detector circuits 20$i$ and 20$j$, and an AND gate 82 for outputting a logical product Ai * Aj of the coincidence outputs Ai, Aj of said two coincidence detector circuits 20$i$ and 20$j$.

In the present embodiment, the logical sum Ai+Aj can not only be outputted from the OR gate 80, but the logical product Ai * Aj can be outputted from the AND gate 82, and hence the flexibility of a circuit design is improved.

Particularly, in the case where a coincidence detector circuit is employed as the coincidence detector circuits 20$i$, 20$j$ which circuit can output the don't care by pull-up as well as a 0 output by pull-down as disclosed in the third and fourth embodiments, the outputs Ai, Aj of the coincidence detector circuits can be set independently of the input signals Ii, Ij. This eases the formation of the don't care, etc., to the next stage OR gate 80 and AND gate 82 to improve the flexibility of logic configuration.

We claim:

1. A programmable logic device, comprising at least one logic circuit, each logic circuit comprising a coincidence detector and a plurality of input signal selectors connected to the coincidence detector, each of the plurality of selectors having an input signal having a logic level, and selectively outputting an output signal to the coincidence detector, each of the plurality of selectors comprising:

an inverter for inverting the logic level of the input signal and outputting an inverted signal in parallel to the input signal;

a non-inverted switching element for selectively outputting the input signal to a common output line in response to a first memory signal;

an inverted switching element for selectively outputting the inverted signal to the common output line in response to a second memory signal;

a first memory cell for outputting the first memory signal;

a second memory cell for outputting the second memory signal, wherein at least one of the plurality of selectors further comprises a first switching element and a second switching element, connected in series between an input terminal having a predetermined signal and the common output line, for selectively outputting as the output signal one of the predetermined signal, the input signal and the inverted signal in response to the first and second memory signals; and means for forcing, when one of the first and second memory cells outputs its memory signal having one of a high logic level and a low logic level, the other of the first and second memory cells to output its memory signal having the other of the high and low logic levels.

2. The programmable logic device of claim 1, wherein the first and second switching elements are p channel MOS transistors.

3. The programmable logic device of claim 1, wherein the predetermined signal is one of a predetermined high logic level signal and a predetermined low logic level signal.

4. The programmable logic device of claim 3, wherein the input terminal is connected to one of a power supply line to provide the predetermined high logic level signal and a ground line to provide the predetermined low logic level signal.

5. The programmable logic device of claim 1, wherein the coincidence detector is a first AND gate having a plurality of inputs equal to the plurality of selectors, for outputting as a coincidence signal a product of the output signals of the plurality of selectors.

6. The programmable logic device of claim 5, further comprising at least one second AND gate for outputting a logical product of the coincidence signals from the at least one logic circuits; and at least one OR gate, for outputting a logical sum of the coincidence signals from the at least one logic circuits.

7. A programmable logic device, comprising at least one logic circuit, each logic circuit comprising a coincidence detector and a plurality of input signal selectors connected to the coincidence detector, each of the plurality of selectors having an input signal having a logic level, and selectively outputting an output signal to the coincidence detector, each of the plurality of selectors comprising:

an inverter for inverting the logic level of the input signal and outputting an inverted signal in parallel to the input signal;

a non-inverted switching element for selectively outputting the input signal to a common output line in response to a first memory signal;

an inverted switching element for selectively outputting the inverted signal to the common output line in response to a second memory signal;

a first memory cell for outputting the first memory signal; and a second memory cell for outputting the second memory signal, wherein at least one of the plurality of selectors further comprises a first switching element and a second switching element, connected in series between a high logic level signal line and the common output line for selectively outputting as an intermediate signal one of a high logic level signal, the input signal and the inverted signal in response to the first and second memory signals, a third switching element connected in series between the second switching element and the common output line for selectively outputting as the output signal the intermediate signal in response to a third memory signal, a fourth switching element connected between a low logic level signal line and the common output line for selectively outputting as the output signal a low logic level signal in response to a third memory signal, and a third memory cell for outputting the third memory signal, such that when the third memory signal has a high logic level, the fourth switching element is selected, and when the third memory signal has a low logic level, the third switching element is selected.

8. The programmable logic device of claim 7, wherein each of the plurality of selectors further comprises means for forcing, when one of the first and second memory cells outputs its memory signal having one of a high logic level and a low logic level, the other of the first and second memory cells to output its memory signal having the other of the high and low logic levels.

9. The programmable logic device of claim 7, wherein the first, second and third switching elements are p channel transistors and the fourth switching element is an n channel transistor.

10. The programmable logic device of claim 7, wherein the high logic level signal line is a power supply line, and the low logic level signal line is a ground line.

11. The programmable logic device of claim 7, wherein the coincidence detector is a first AND gate having a plurality of inputs equal to the plurality of selectors, for outputting as a coincidence signal a product of the output signals of the plurality of selectors.

12. The programmable logic device of claim 11, further comprising at least one second AND gate for outputting a logical product of the coincidence signals from the at least one logic circuit; and at least one OR gate, for outputting a logical sum of the coincidence signals from the at least one logic circuit.

13. A programmable logic device, comprising at least one logic circuit, each logic circuit comprising a coincidence detector and a plurality of input signal selectors connected to the coincidence detector, each of the plurality of selectors having an input signal having a logic level, and selectively outputting an output signal to the coincidence detector, each of the plurality of selectors comprising:

an inverter for inverting the logic level of the input signal and outputting an inverted signal in parallel to the input signal;

a non-inverted switching element for selectively outputting the input signal to a common output line in response to a first memory signal;

an inverted switching element for selectively outputting the inverted signal to the common output line in response to a second memory signal;

a first memory cell for outputting the first memory signal; and a second memory cell for outputting the second memory signal, wherein at least one of the plurality of selectors further comprises a first switching element and a second switching element connected in series between a high logic level signal line and the common output line, and a third switching element and a fourth switching element connected in series between a low logic level signal line and the common output line, for selectively outputting as the output signal one of a high logic level signal, a low logic level signal, the input signal and the inverted signal in response to the first and second memory signals.

14. The programmable logic device of claim 13, wherein each of the plurality of selectors further comprises means for forcing, when one of the first and second memory cells outputs its memory signal having one of a high logic level and a low logic level, the other of the first and second memory cells to output its memory signal having the other of the high and low logic levels.

15. The programmable logic device of claim 13, wherein the first and second switching elements are p channel transistors and the third and fourth switching elements are n channel transistors.

16. The programmable logic device of claim 13, wherein the high logic level signal line is a power supply line, and the low logic level signal line is a ground line.

17. The programmable logic device of claim 13, wherein the coincidence detector is a first AND gate having a plurality of inputs equal to the plurality of selectors, for outputting as a coincidence signal a product of the output signals of the plurality of selectors.

18. The programmable logic device of claim 13, further comprising at least one second AND gate for outputting a logical product of the coincidence signals from the at least one logic circuit; and at least one OR gate, for outputting a logical sum of the coincidence signals from the at least one logic circuit.

* * * * *

UNITED STATES PATENT AND TRADEMARK OFFICE
CERTIFICATE OF CORRECTION

PATENT NO. : 5,202,592
DATED : April 13, 1993
INVENTOR(S) : Masato YONEDA and Hisaya KEIDA It is certified that error appears in the above-identified patent and that said Letters Patent is hereby corrected as shown below:

On the title page:
<u>IN THE ABSTRACT</u>

Line 2, change "$40 - 40_3$" to --$40_0 - 40_3$--.

Line 13, change "$42_1 - 42_3$" to --$42_0 - 40_3$--

Column 4, line 27, change "$42_1$ through $42_3$" to --$42_0$ through $42_3$--; and line 36, change "a logical logic signal" to --a negative logical signal--.

Column 6, line 62, change "digram" to --diagram--.

Signed and Sealed this

Seventh Day of February, 1995

Attest:

BRUCE LEHMAN

Attesting Officer     Commissioner of Patents and Trademarks